US008369143B2

(12) United States Patent
Franca-Neto et al.

(10) Patent No.: US 8,369,143 B2
(45) Date of Patent: *Feb. 5, 2013

(54) EARLY DETECTION OF DEGRADATION IN NOR FLASH MEMORY

(75) Inventors: Luiz M. Franca-Neto, Sunnyvale, CA (US); Richard Leo Galbraith, Rochester, MN (US); Travis Roger Oenning, Rochester, MN (US)

(73) Assignee: HGST Netherlands B.V., Amsterdam (NL)

( * ) Notice: Subject to any disclaimer, the term of this patent is extended or adjusted under 35 U.S.C. 154(b) by 17 days.

This patent is subject to a terminal disclaimer.

(21) Appl. No.: 12/930,019

(22) Filed: Dec. 22, 2010

(65) Prior Publication Data

US 2012/0163073 A1 Jun. 28, 2012

(51) Int. Cl.
*G11C 11/34* (2006.01)
(52) U.S. Cl. .......... 365/185.03; 365/185.18; 365/185.24
(58) Field of Classification Search ............ 365/185.02, 365/185.03, 185.05, 185.09, 185.17, 185.18, 365/185.2, 185.24
See application file for complete search history.

(56) References Cited

U.S. PATENT DOCUMENTS

| 5,715,193 | A | 2/1998 | Norman |
| 6,172,910 | B1 | 1/2001 | Lee |
| RE41,485 | E | 8/2010 | Tanaka et al. |
| 7,782,674 | B2 | 8/2010 | Roohparvar et al. |
| 2008/0192544 | A1 | 8/2008 | Berman et al. |
| 2008/0307270 | A1 | 12/2008 | Li |
| 2009/0103365 | A1* | 4/2009 | Roohparvar et al. .... 365/185.17 |
| 2009/0116283 | A1* | 5/2009 | Ha et al. ................ 365/185.2 |
| 2009/0201738 | A1* | 8/2009 | Sato ...................... 365/185.17 |
| 2010/0061148 | A1 | 3/2010 | Komatsu |
| 2010/0162084 | A1 | 6/2010 | Coulson et al. |
| 2010/0214847 | A1 | 8/2010 | Nishihara et al. |
| 2010/0218068 | A1 | 8/2010 | Li et al. |
| 2010/0309726 | A1 | 12/2010 | Yang |

OTHER PUBLICATIONS

Inoue et al., "NAND Flash Applications Design Guide," Apr. 2003, System Solutions from Toshiba America Electronc Components, Inc., Rev. 1.1. pp. 1-29.*
B. Ricco, et al., "Nonvolatile Multilevel Memories for Digital Applications," Proceedings of the IEEE, vol. 86, No. 12, Dec. 1998; pp. 2399-2421.
A. Chimenon and P. Olivo, "Erratic Erase in Flash Memories—Part I: Basic Experimental and Statistical Characterization," IEEE Trans. Elect. Dev., vol. 50, No. 4, Apr. 2003; pp. 1009-1014.
T. Tanzawa et al., "A Compact On-Chip ECC for Low Cost Flash Memory," IEEE J. Solid-State Circ., vol. 32, No. 5, May 1997, pp. 662-669.

(Continued)

*Primary Examiner* — VanThu Nguyen
*Assistant Examiner* — Hien Nguyen
(74) *Attorney, Agent, or Firm* — G. Marlin Knight

(57) ABSTRACT

The embodiments of the invention in this disclosure describe techniques for early warning of degradation in NOR Flash memories by estimating the dispersion of the threshold voltages ($V_T$'s), of a set of NOR Flash memory cells during read operations. In an embodiment invention the time-to-completion (TTC) values for the read operation for the memory cells are used as a proxy for dispersion of the threshold voltages ($V_T$'s). If the measured TTC dispersion differs by more than a selected amount from the reference dispersion value, a warning signal is provided to indicate that the page of memory has degraded significantly. Higher level components in the system can use the warning signal to take appropriate action. Since every cell's $V_T$ position in an ideal distribution can be estimated, the data from each cell can have a confidence level assigned based on deviation from the mean of an ideal distribution.

20 Claims, 9 Drawing Sheets

OTHER PUBLICATIONS

S. Yamada et al., "Degradation Mechanism of Flash EEPROM Programming After Program/Erase Cycles," IEEE IEDM, 1993; vol. 38, Issue 2, Feb. 27, 1998, pp. 185-188.

Tanaka, et al.; "A quick intelligent page-programming architecture and a shielded bitline sensing method for 3 V-only NAND flash memory", IEEE Journal of Solid-State Circuits, vol. 29 Issue:11, Nov. 1994; pp. 1366-1373.

I.E. Opris, "Rail-to-Rail-Multiple-Input Min/Max Circuit," IEEE Trans. Circ. & Systems II, vol. 45, No. 1, Jan. 1998, pp. 137-140.

Douglas Sheldon & Micheal Freie, "Disturb Testing in Flash Memories," NASA WBS: 939904.01.11-10 JPL Project No. 102197; Task No. 1.23.6; 2008. Accessed Nov. 10, 2010 at Internet address http://trs-new.jpl.nasa.gov/dspace/bitstream/2014/40761/1/08-07.pdf.

* cited by examiner

EARLY DETECTION OF DEGRADATION IN NOR FLASH MEMORY

RELATED APPLICATIONS

A related application by the inventors of the present application, which is commonly assigned application and which was filed concurrently with the present application, is titled "Early Detection of Degradation in NAND Flash Memory." The serial number is Ser. No. 12/930,016 with a filing date of Dec. 22, 2010.

A related application by the inventors of the present application, which is commonly assigned application and which was filed concurrently with the present application, is titled "Early Degradation Detection in Flash Memory using Test Cells" The serial number is Ser. No. 12/930,020 with a filing date of Dec. 22, 2010.

FIELD OF THE INVENTION

The present disclosure relates generally to non-volatile semiconductor memory, and more particularly to techniques for increasing the reliability of NOR Flash memory by early detection of degradation of performance in NOR Flash memory.

BACKGROUND

EEPROM and Flash memories (NOR and NAND) use a floating gate (FG) to store charges, which represent information. These memory devices suffer from degradation mechanisms after program/erase cycles. They also suffer from erratic erase of memory cells. The specific matrix architecture of NAND Flash leads to more "read disturb" errors than NOR Flash. A "read disturb" occurs when the amount of charge in a memory cell is altered by reading another cell, physically close to or sharing control lines with the disturbed cell. A single read disturb event may not produce enough change in charge content to effect an error, but cumulative read disturbs may eventually do so.

Scaling of technology and the interest in storing more than one bit per cell for increased storage density requires tighter fabrication and operation tolerances. The recognition that ever denser EEPROM and Flash memories need to address unavoidable occasional bit errors led to solutions including error correcting codes.

Multi-Level Cell (MLC) Flash devices can store multiple bits per memory cell by charging the floating gate of a transistor to different selected threshold voltage ($V_T$) levels and, thereby, use the analog characteristic of the cell in mapping a bit pattern to a specific voltage level. In the case of NAND Flash, the $V_T$ of MLC devices are, conceptually, read by sequentially applying selected read voltage ($V_{READ}$) levels to the floating gates of the cells. Typically, the voltage ranges are selected with a guardband between each range to help ensure that the normal $V_T$ distributions do not overlap.

In NOR Flash, cells are connected in parallel to the bitlines, which allows cells to be individually read and programmed.

Published U.S. patent application 20080307270 by Tieniu Li (Dec. 11, 2008) describes a scheme implemented on a host device for detection of emerging bad blocks in a NAND that includes keeping at least a partial history of errors during read operations.

Published U.S. patent application 20100214847 by Nishihara, et al. describes a NAND Flash memory system that is said to reduce variations in the read disturb characteristic from chip to chip by that including a peripheral circuit that includes means for storing and retrieving a corrected read voltage for use by a memory controller. The memory controller performs data input/output control and data management on the Flash memory, adds error correction codes (ECC) upon writing, and analyzes the error correction codes upon reading.

Given that degradation of memory content is progressive and unavoidable with time and number of program/erase cycles, there is a need for an early warning system that detects degradation while data is still correctly being read and mitigating actions can be taken without data loss. Such a system can stand alone or be complementary to error correcting schemes to further increase reliability and operational life of EEPROM and Flash memories.

SUMMARY OF THE INVENTION

The embodiments of the invention in this disclosure describe techniques for early warning of degradation in NOR Flash memories by estimating the dispersion of the threshold voltages ($V_T$'s), of a set of NOR Flash memory cells during read operations. Extension of the operational life of Flash memories is enabled by such an early warning system, for instance, by identifying data at risk of becoming corrupted which can then be moved to another location in the Flash chip in response to early signs of degradation. In particular for applications where freshly written data will be likely to be read first, this will tend to extend operational life of the device to the limit where (a) there is available space into which data can be moved and (b) these refreshing actions take significant less time to reconstitute data than the degradation mechanisms take to corrupt freshly written data.

In an embodiment invention the time-to-completion (TTC) values for the read operation for the memory cells are used as a proxy for dispersion of the threshold voltages ($V_T$'s). The TTC is the time from triggering sensing in the Flash memory sense amplifier's circuits to full voltage development in those sense amplifiers used in the read operation of the memory cells. In such an embodiment of the invention, the read controller for a NOR Flash memory cell structure includes a TTC Measurement Unit which measures the time-to-completion (TTC) of the read operation and reports the TTC to a Dispersion Analyzer. The TTC Measurement Unit includes means for determining the TTC for each of the sense amplifiers. The representative TTC for the read operation is then selected by a multiplexor (MUX) using the output from a Thermometer Decoder.

The Dispersion Analyzer obtains TTC data for each cell in a set and determines the dispersion of the set of TTC values. In one embodiment the delta between the maximum and minimum TTC values is used as the dispersion measurement. The measured TTC dispersion is then compared to a reference dispersion value. If the measured TTC dispersion differs by more than a selected amount from the reference dispersion value, a warning signal is provided to indicate that the page of memory has degraded significantly. Higher level components in the system can use the warning signal to take appropriate action such as moving the data to a new page and marking the degrading page as bad, i.e. improper for use, hence decommissioning that page.

In one embodiment the TTC is reported as an analog voltage, and the Dispersion Analyzer determines the spread between the maximum and minimum analog voltage values as the measure of the dispersion of TTC values for the page.

Alternative embodiments include an integrated system for NOR Flash memory that provides soft information for error correcting codes in a single readout operation based on the dispersion of $V_T$s. The early warning system can also be used as a basis to assign probabilities for the correctness of the data read from memory. With a single read, soft information can be added to the read data, which would enable novel coding and decoding schemes for high density Flash memories. The single read implies that the retrieval of soft information is achieved with no read throughput performance penalty. Since every cell's $V_T$ position in an ideal distribution can be estimated with an early degradation detection system as described in this disclosure, in an embodiment, the data from each cell can have a confidence level assigned depending on how far from the mean of an ideal distribution the $V_T$ from each cell is.

BRIEF DESCRIPTION OF THE FIGURES

FIG. 2A is a conceptual schematic, and FIG. 2B shows an improvement with current mirrors and several sense amps in parallel, each with its own reference voltage, switching at the same time.

DETAILED DESCRIPTION OF THE INVENTION

Figure 1A:
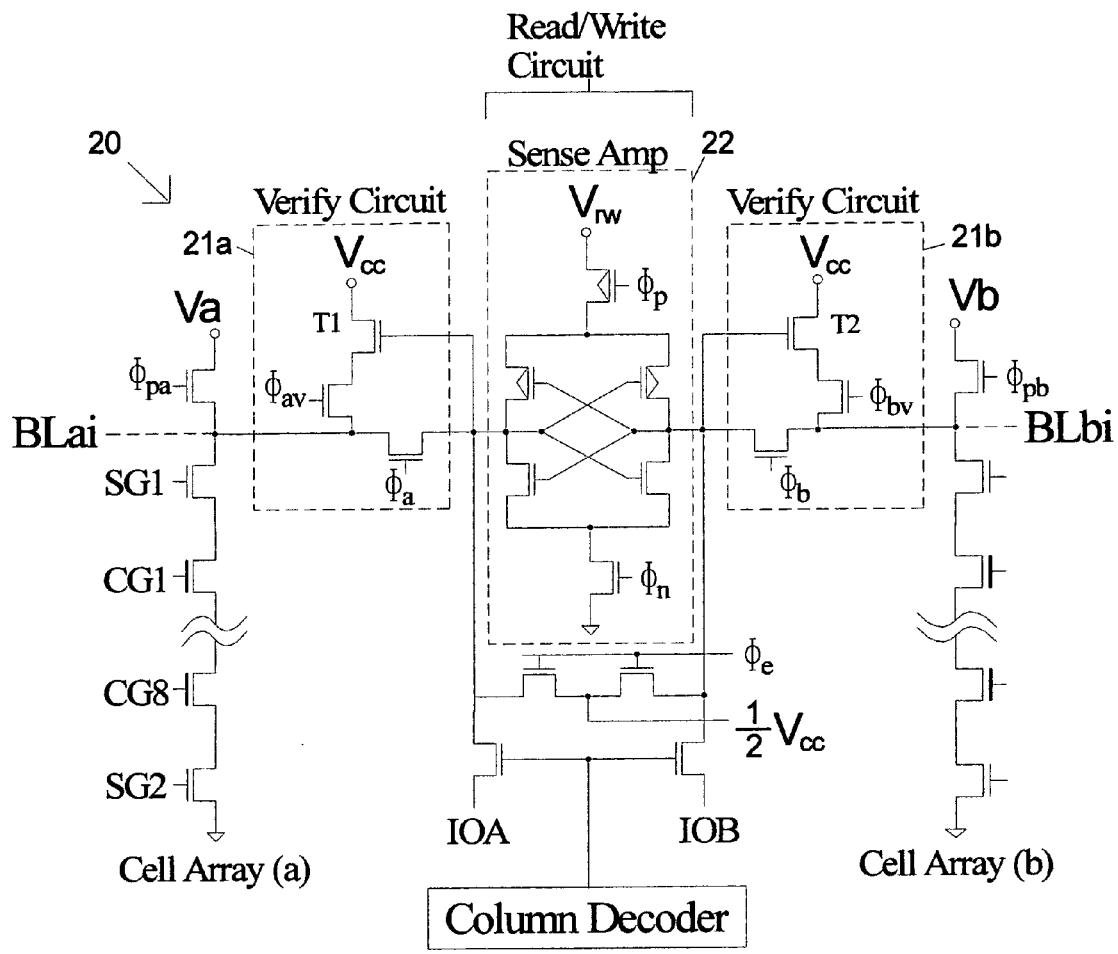
FIG. 1A is an illustration of a prior art NAND Flash memory cell structure.

A prior art NAND Flash memory cell structure 20 is illustrated in FIG. 1A. Note that other memory cells, with any valid programmed $V_T$ levels, are placed in series with a NAND Flash memory cell being queried. (Note: This is not the case for NOR Flash memory.) The NAND-structured cells are divided into two cell strings with cell string (a) shown as the left-hand column of transistors from the actual memory array and cell string (b) as the right-hand column of reference transistors. The cell structure 20 includes by bit-by-bit verify (BV) circuits 21a, 21b which are connected to each of the two bitlines BLai, BLbi. The two bitlines and BV circuits share a common READWRITE (R/W) circuit similar to an open-bit-line architecture of a DRAM. The R/W circuit acts as a flip-flop type differential sense amplifier 22 in the read operation and as a data latch circuit in the program/write operation.

Figure 1B:
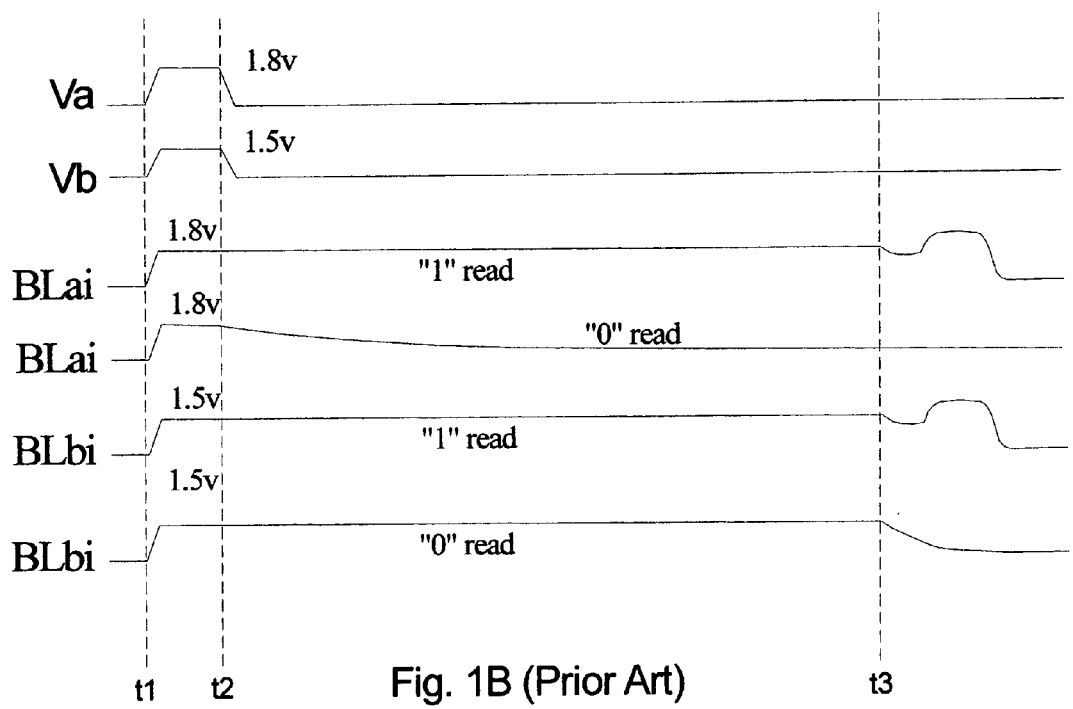
FIG. 1B is an illustration of selected timing curves for a read operation for the prior art. NAND Flash memory cell structure of FIG. 1A.

Selected timing curves for a read operation of the structure of FIG. 1A are shown in FIG. 1B with selected points in time t1, t2 and t3. For simplicity, all timing diagrams and discussions assume perfectly matched readout circuits for the parallel reading of all cells in a page. Mismatches in those circuits can be accounted for by simple calibration procedures. For instance, a reference readout using specific cells with known content can be used to correct sense amps mismatches in later readouts of cells in the memory array.

Figure 1C:
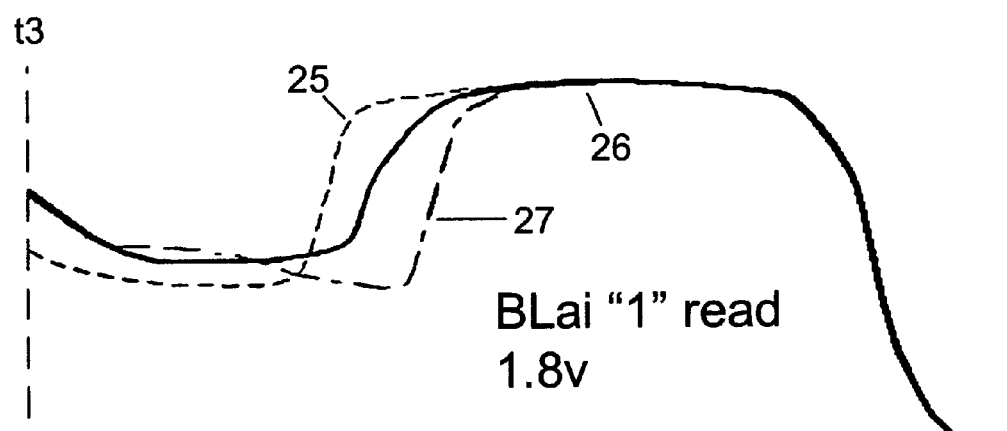
FIG. 1C is an illustration of selected timing curves for a read operation for a set of prior art NAND Flash memory cell structures of FIG. 1A showing a possible range of timing curves for the set.

The sense amplifier 22, which is a comparator, typically uses a regenerative loop to develop a small separation of input lines after the pass gates from bitlines BLai and BLbi in FIG. 1A into fully developed output voltage levels. The circuit in FIG. 1A and the curves in FIG. 1B are fairly representative of a NAND Flash readout. FIG. 1C is an illustration of a selected portion following t3 of the BLai "1" read for 1.8v a set of prior art NAND Flash memory cell structures of FIG. 1C shows the typical timing curve 26 and an example of a possible range of timing curves for a set of cells bounded by lines 27, 28. The BLbi signal for a set of cells will show a similar distribution of timing curves. The NOR Flash circuits, which are discussed below, also show a similar distribution of timing curves. Embodiments of the invention for NAND and NOR Flash memory detect changes in the dispersion in the performance of a page of cells by measuring or estimating the time to completion (TTC) for the set of cells. Dispersion in the timing of the rising portion of the curves will become differences in time to completion (TTC) for the read operation. It should be noted that FLASH readout circuits typically include features to ensure that normal dispersion in timing performance never produces errors in readout, i.e. the circuits are "sandbagged." Thus, the invention is this disclosure brings to light an aspect of Flash memory that was not well known by those practicing the art and uses the phenomenon in novel applications.

Figure 2A:
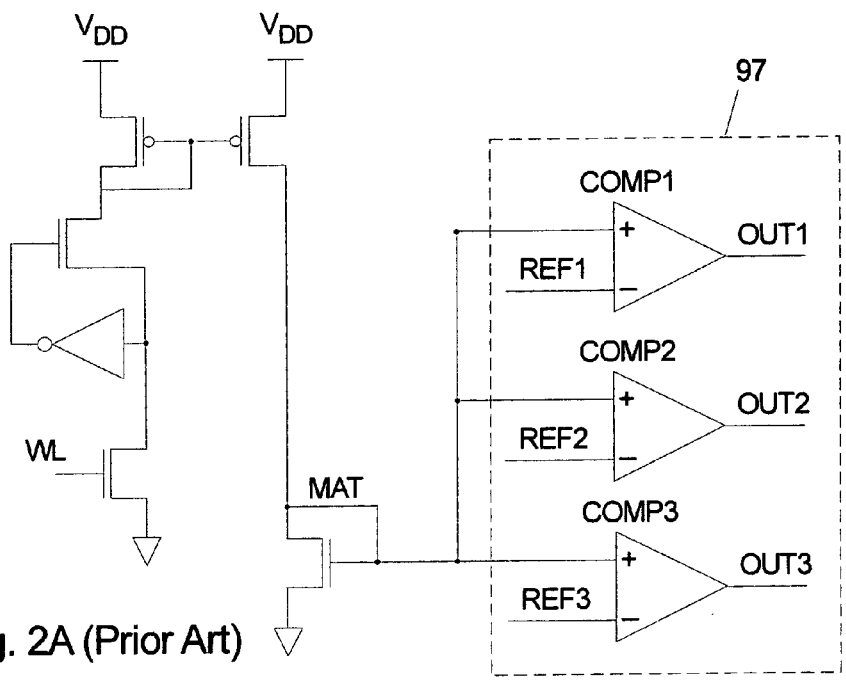
FIGS. 2A and 2B illustrate a prior art multilevel NOR Flash memory with parallel bank of sense amplifiers for fast read out.
Figure 2B:
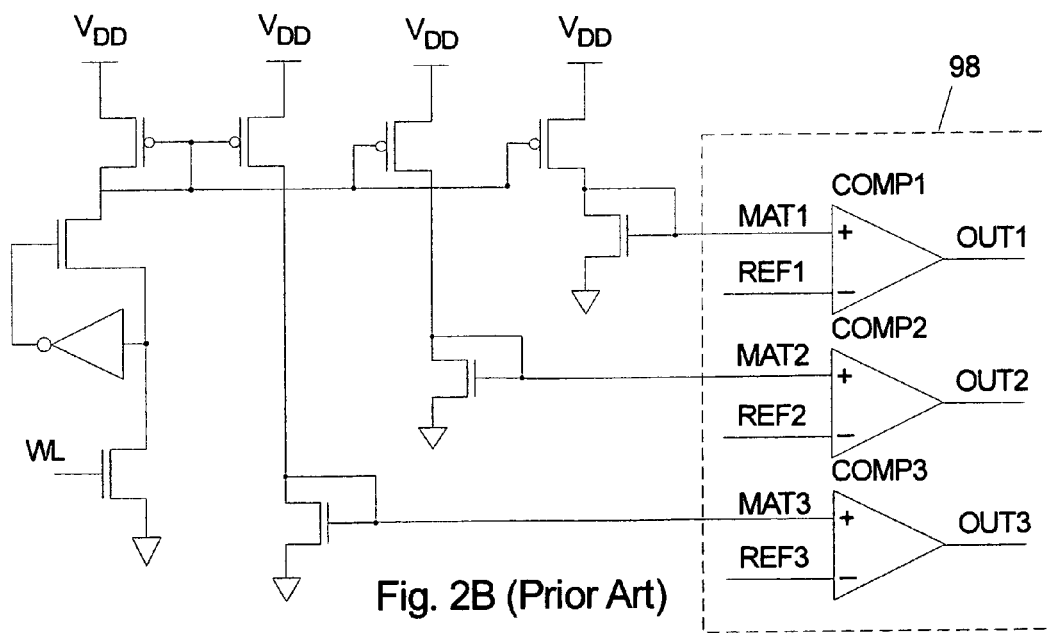

Prior art NOR Flash memory cells and respective sense amplifiers are arranged as indicated in FIGS. 2A and 2B in simplified schematic to highlight fundamental operation. Recall that only column decoder transistors are placed in series with a NOR Flash memory cell and the sensing circuits. Because of that, readout of NOR Flash cells, either single level cells (SLC) or multilevel cells (MLC) can be done in parallel as in an analog-to-digital converter circuit and the $V_T$ programmed in each cell determined in a single query (which is different from the NAND Flash case, where sequential querying is necessary). The comparators COMP1-3 typically use a regenerative loop to develop a small separation of input lines (bit lines MAT1-3, REF1-3) into fully developed output voltage levels. The circuit and timing performance are fairly representative of both single level cell (SLC) and multi-level cell (MLC) readouts.

The prior art multilevel cell (MLC) Flash memory circuits of FIGS. 2A and 2B have been modified to include appropriate reference comparisons (REF1-3) as indicated. The parallel, simultaneous operation of a bank of sense amplifiers 97, 98 (COMP1-3) is used because, as mentioned, only column decoder transistors are in series with the memory cell being read in NOR Flash and proper reference voltages can be defined for determining the threshold voltage of a memory cell under read operation.

The principles of the early detection system for a NOR Flash according to the invention can be explained by observing that:

1) Since several memory cells are read in parallel in a NOR Flash, and this read operation is launched by the same properly defined time signals, which equalize the lines of all sense amplifiers involved in the read operation and trigger the sensing, stronger and weaker cells will separate the sense amplifier lines differently (after equalization) and the time from triggering sensing to full voltage development at the output of the sense amps, which will be referred to as "time to completion" (TTC), will be different for stronger and weaker cells.

2) Since all memory cells in the NOR Flash matrix are nominally identical, and each one is programmed to a threshold voltage, $V_T$, that produces a predetermined current level when queried with an specific voltage level immediately above their programmed $V_T$, then:

(i) the dispersion in time in TTC as defined in (1) will be a proxy for the dispersion in $V_T$ of the cells being read.

(ii) values of dispersion in TTC at the start of life of a Flash memory can be saved and compared to the dispersion in TTC at later read outs to determine when memory cells have degraded beyond a limit that warrants data protection action. A selected value for the dispersion reference value can also be used in place of an actual measured value.

(iii) the knowledge of the dispersion in TTC for all cells in a read operation can be used to assign soft information to each determined memory cell content.

Figure 3:
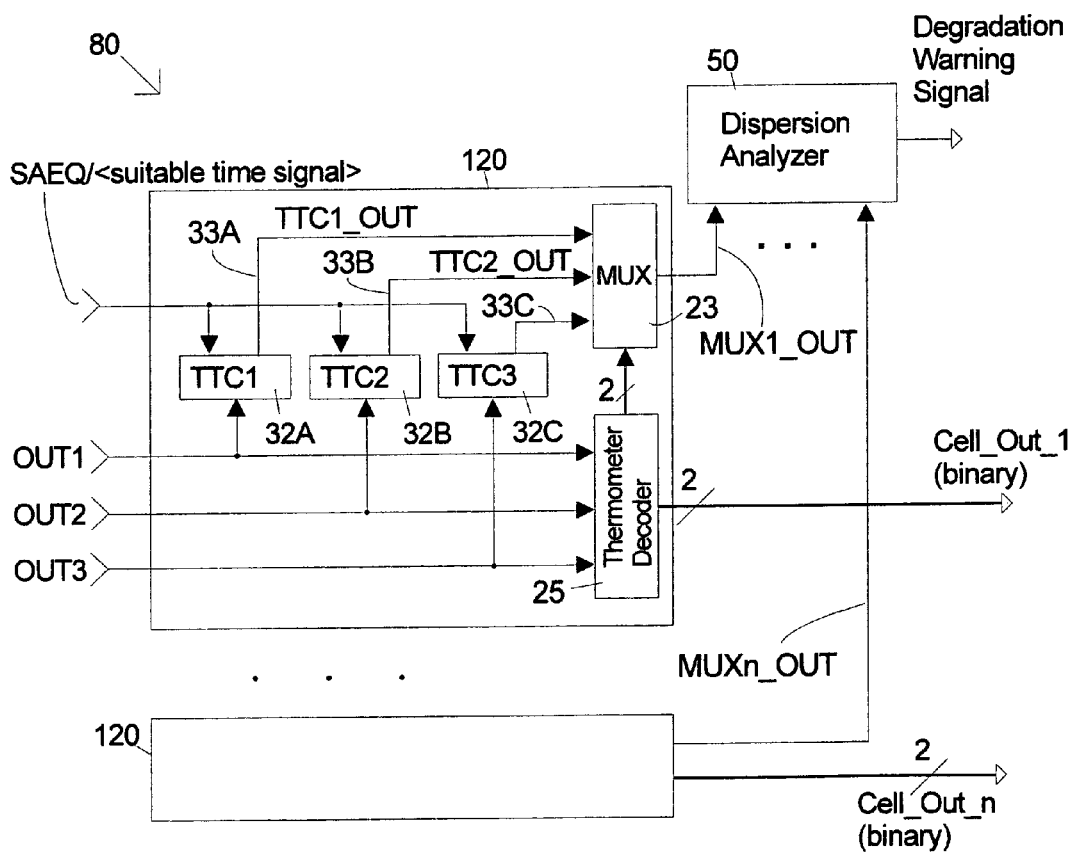
FIG. 3 is an illustration of selected components in a NOR Flash memory system according to an embodiment of the invention.

FIG. 3 illustrates selected components in a NOR Flash memory 80 with an Early Detection System according to an embodiment of the invention. The Dispersion Analyzer 50 for the NOR embodiments of the invention is comparable to the Dispersion Analyzer for the NAND embodiments of the invention, but the inputs will be different as described below. Dispersion Analyzer 50 receives input from a plurality (1 . . . n) of TTC Measurement Units 120 which are shown as generating the MUX1_OUT . . . MUXn_OUT signals. A 4-level NOR Flash memory is assumed for the embodiment, but is not a limiting condition. The sense amplifiers 98 will only develop their outputs (OUT1-3) to full positive rail when input references are above the $V_T$ of the memory cell under read operation (MAT1-3). Thus, the three Time-To-Completion (TTC1-3) units 32A-C will develop finite values for time to completion, i.e. finite values for voltages at their output only for those comparisons where $V_{READ}$ is above $V_T$. The other TTC units' blocks will saturate their output at full rail voltage.

The prior art Thermometer Decoder (TD) 25, which outputs the content of the memory cell in binary format in this illustration, also provides the screening signal for the analog multiplexor (MUX) 23 for the proper selection of the voltage representing time-to-completion of the memory cell content to be sent to the Dispersion Analyzer 50. The Dispersion Analyzer 50 will set the degradation warning signal if dispersion of the values in time-to-completion (TTC) for all the cells (or a subset of all the cells) read in a readout operation is larger than a pre-configured value.

Figure 7:
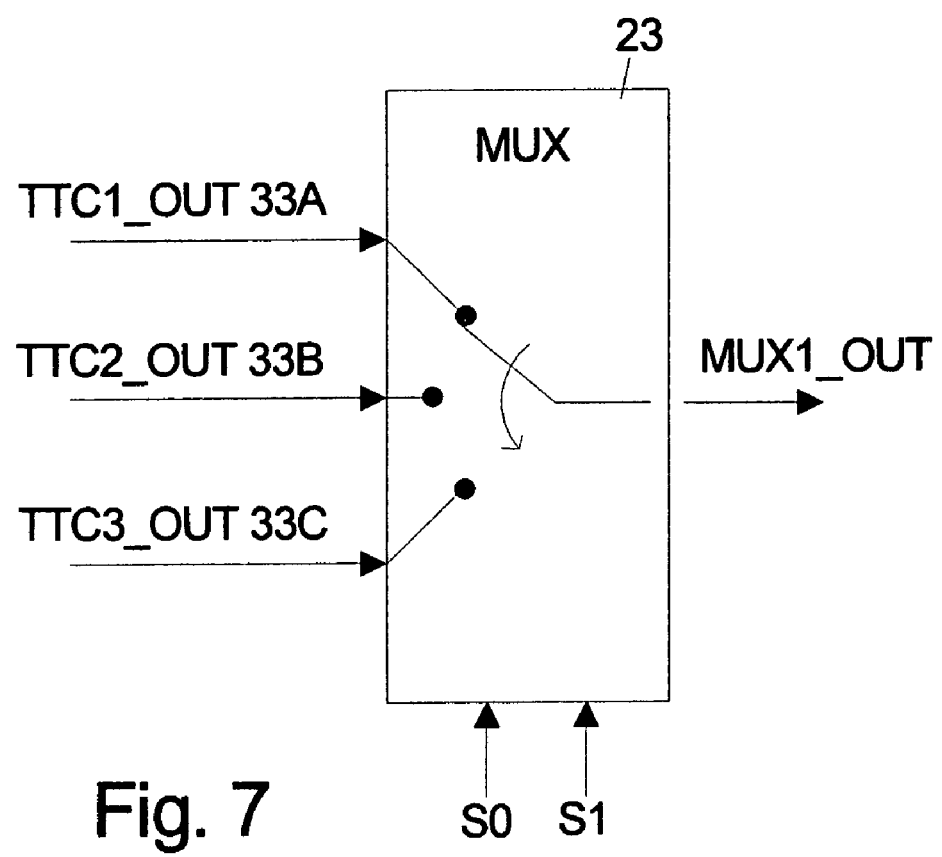
FIG. 7 is an illustration of a design for a multiplexor (MUX) for use in an embodiment of the invention.

FIG. 7 is an illustration of a design for a multiplexor (MUX) 23 an embodiment of the invention. The inputs for the MUX 23 are outputs (TTC1_OUT 33A, TTC2_OUT 33B, TTC3_OUT 33C) from the respective TTC units 32A-C. The MUX selects one of these inputs to pass on to the Dispersion Analyzer as the MUX1_OUT signal. The MUX 23 can be conceptually described as an analog array of pass gates. But several different realizations are possible for the function of transferring the voltage level from the output of one of the three TTC units 32A-C to an input of the Dispersion Analyzer 50, with proper buffers and signal conditioning circuits.

In an embodiment of the NOR Flash readout circuit, the signal from the queried memory cell is compared in parallel against reference replica voltages (REF1-3) corresponding to the different content charge levels the queried memory cell could hold. Depending on design choices, some outputs from the comparators COMP1-3 in this illustration will present value '0' and some the remaining value '1', where '0' and '1' will appear as if in a thermometer scale, i.e., output '0's for instance at OUT2 and OUT3, and output '1' at OUT1, or output '0' at OUT3 and output '1' at OUT1 and OUT2 being two examples of possible outputs.

The Thermometer Decoder 25 will then covert this thermometer scale output to binary coding. In an embodiment, the first of the OUT1-3 signals to hold an output '1' represents the first reference level above the threshold level ($V_T$) of the cell being queried and its position will also be coded into the signal S (s0,s1) from the Thermometer Decoder 25 to be sent to the MUX 23. Signal S is determined by the Thermometer Decoder, which, in an embodiment, works as a thermometer decoder for the memory cell content readout. In a conceptual description, but in no limiting sense, signal S (s0,s1) selects which TTC1-3 signal is the time to completion (TTC) to be reported forward by the MUX to the Dispersion Analyzer.

Figure 4:
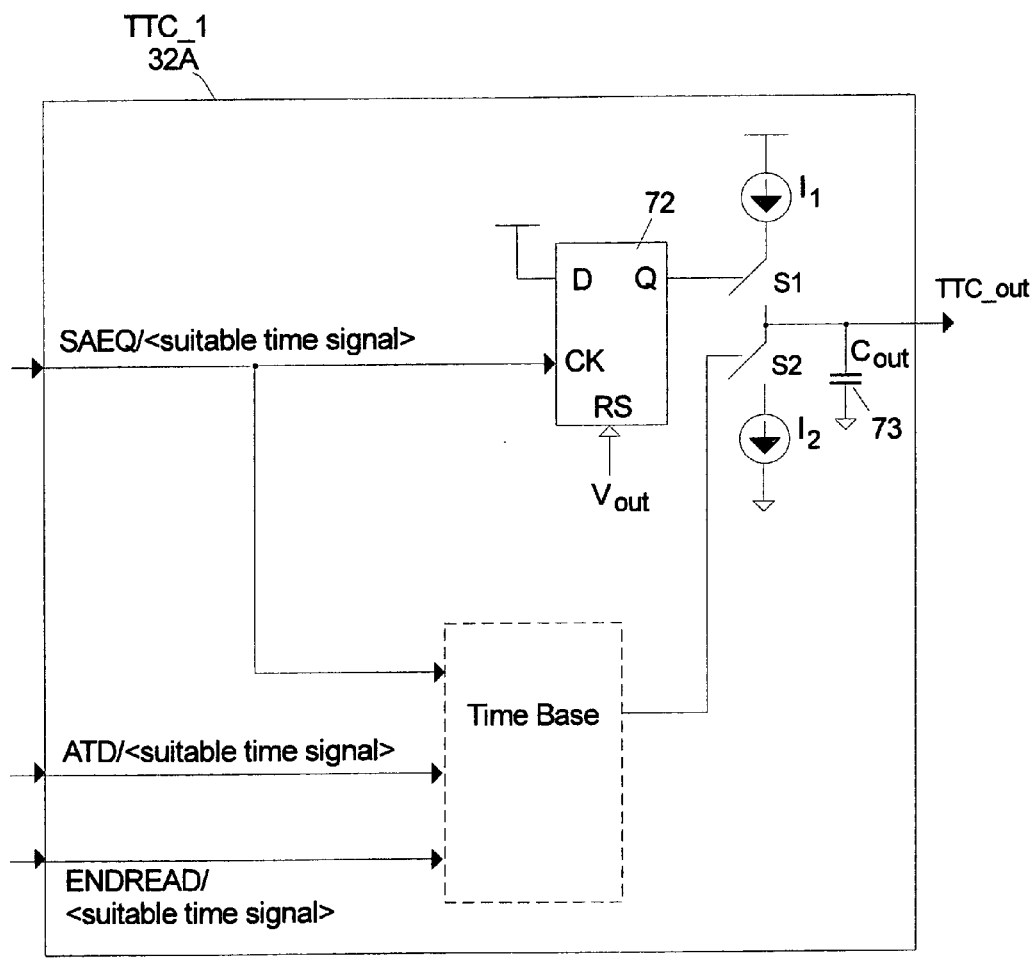
FIG. 4 is an illustration of selected functional design blocks for a time-to-completion measurement unit according to an embodiment of the invention.

An embodiment of the TTC units 32A-C is shown in FIG. 4. It is similar to charge-pump circuits used in Phase-Locked Loop (PLL) circuits, where phase separation between the VCO frequency and a reference frequency is to be determined for corrective action. The time from sense amplifier equalizing (SAEQ) signal rise to $V_{out}$ (OUT1-3 respectively) rise is converted into a voltage level on the capacitor $C_{out}$. Standard timing signals Address Transition Detection (ATD) and ENDREAD or other comparable signals are also used. A buffer circuit (not shown) may be used between the output of the TTC block and the MUX circuits.

Figure 5:
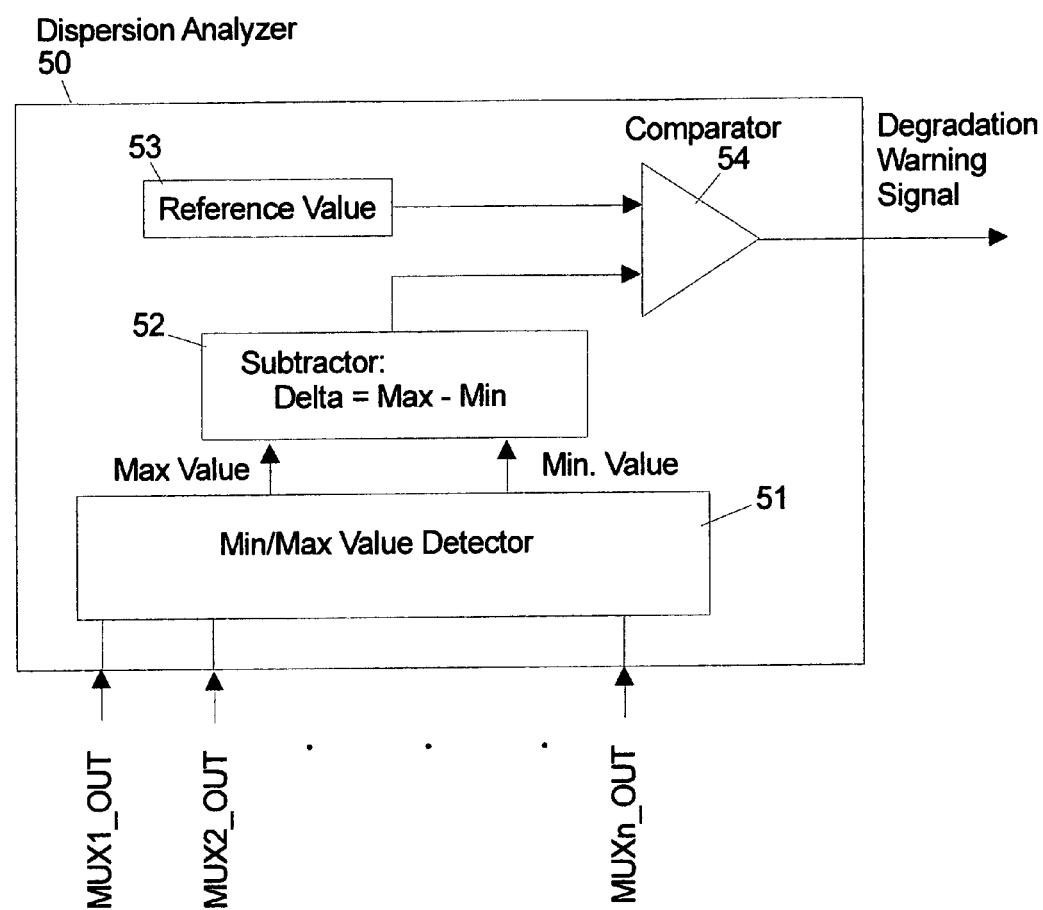
FIG. 5 is an illustration of selected functional design blocks for a dispersion analyzer according to an embodiment of the invention.

FIG. 5 is an illustration of selected functional design blocks for a Dispersion Analyzer 50 according to an embodiment of the invention. The Dispersion Analyzer 50 is an analog signal processing block. In this embodiment, its function includes determining the maximum and minimum time of completion as indicated in the output signals from the plurality of TTC Measurement Units 120 for a page read operation. Each TTC 32A-C outputs an analog voltage level which goes to the MUX 23, which in turn selects one of its three inputs to send on to the Dispersion Analyzer 50. The Min/Max Detector 51 in the Dispersion Analyzer determines the maximum voltage and the minimum voltage at its multiple inputs from the plurality of TTC Measurement Units 120. The difference (delta) between the overall maximum and minimum value is determined as the measure of the dispersion for the page by the Subtractor 52. The Dispersion Analyzer uses Comparator 54 to determine if the computed delta is greater than a Reference Value 53 and sets the warning signal accordingly. The Reference Value is a pre-determined threshold or an initial value established at the beginning of life of the Flash memory. In one embodiment, at the start of operation of the Flash chip in a storage system, after a program command, a read command is issued to establish the Reference Value for comparing future dispersion in $V_T$ at each read operation. Thus, the Reference Value can be set as part of the manufacturing process by having the Dispersion Analyzer compute an initial delta between the overall maximum and minimum value and save that initial delta as the Reference Value.

Figure 6:
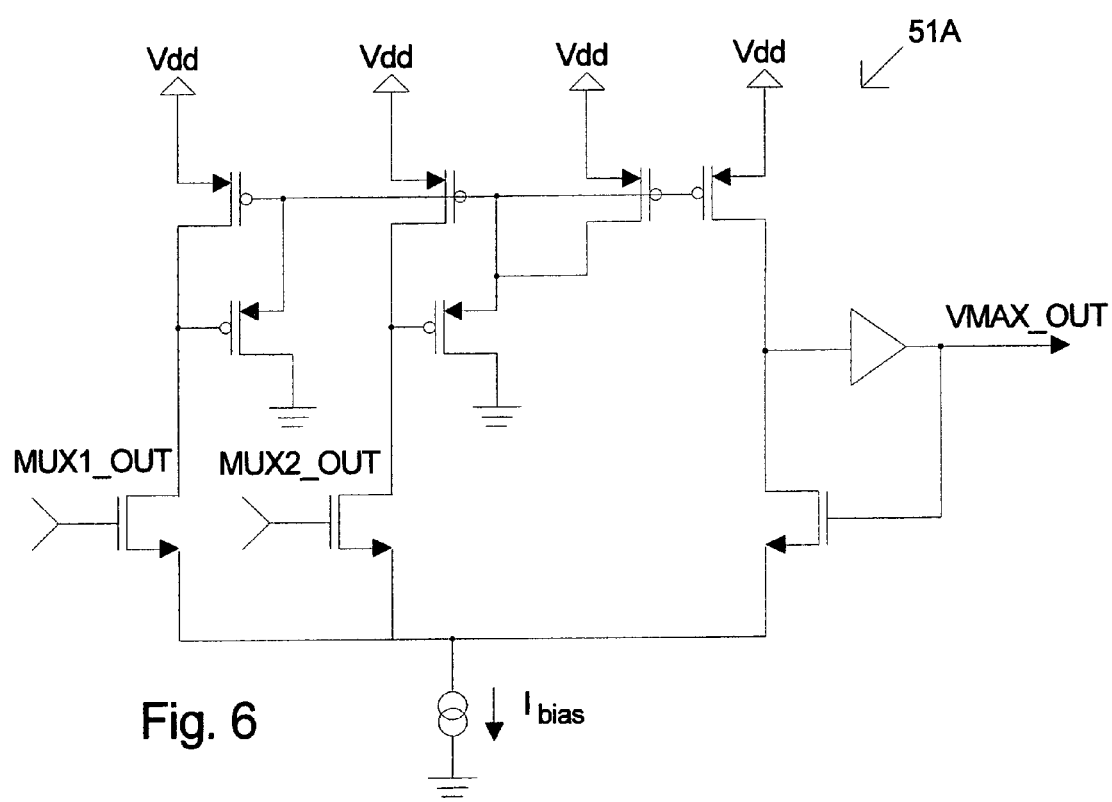
FIG. 6 is an illustration of a design for a maximum voltage detector for use in a dispersion analyzer according to an embodiment of the invention.

FIG. 6 is an illustration of a design for a maximum voltage detector 51A for use in a Min/Max Detector 51 in a Dispersion Analyzer 50 according to an embodiment of the invention. In FIG. 6, an example of a CMOS circuit for maximum input voltage determination is shown. It is a "winner-takes-all" circuit. The output of this circuit follows the maximum input voltage to the accuracy of 1 mV difference between input levels. The number of inputs in the circuit can be straightforwardly augmented by replication of the circuits, or the two input circuit can be arrayed in a hierarchical tree. In order to follow the minimum input voltage, a suitable change in the inset circuit from NMOS to PMOS is used.

Support for error correcting code schemes where soft information is required, can be developed for an embodiment of the invention by noting the Dispersion Analyzer has information about the time-to-completion from all the cells which were read. Suitable probability of correctness can be assigned to the final binary results from the position of its originating cell in the dispersion of time to completion results. All requiring a single readout.

While the present invention has been shown and described with reference to particular embodiments, the invention is limited in scope only as specified in the appended claims.

The invention claimed is:

1. A NOR Flash memory device comprising:
   a set of NOR Flash memory cells;
   a set of measurement units with each measurement unit producing a measurement signal that is a measure of a memory cell's time to completion in a read operation; and
   a dispersion analyzer that receives the measurement signals and determines a current dispersion value for the measurement signals for the set of memory cells, and generates an output signal indicative of the current dispersion value differing from a reference dispersion value by more than a threshold amount.

2. The NOR Flash memory device of claim 1 wherein:
   each memory cell includes a plurality of sense amplifiers, which compare an stored input value with a reference value and generate a corresponding binary output signal having a "0" or "1" value;
   each measurement unit further comprising means for generating a plurality of time-to-completion values that measure a time to completion for the read operation for each of the sense amplifiers; and
   each measurement unit further comprising means for selecting the measurement signal from the plurality of time-to-completion values by determining which of the plurality of time-to-completion values corresponds to a first one of the binary output signals to develop a "1" output value.

3. The NOR Flash memory device of claim 2 wherein:
   each measurement unit further comprises a thermometer decoder which receives output from each sense amplifier and determines which sense amplifier is first to develop a "1" output value; and
   the means for selecting the measurement signal further comprising a multiplexor that receives the plurality of time-to-completion values and selects one of the plurality of time-to-completion values that corresponds to a first one of the binary output signals to develop a "1" output value using a signal from the thermometer decoder.

4. The NOR Flash memory device of claim 1 wherein each measurement signal is an analog voltage.

5. The NOR Flash memory device of claim 4 wherein the dispersion analyzer further comprises:
   a maximum detector that outputs a first voltage that corresponds to a maximum voltage in the measurement signals from the set of measurement units;
   a minimum detector that outputs a second voltage that corresponds to a minimum voltage in the measurement signals from the set of measurement units; and
   means for determining a delta between the maximum voltage and the minimum voltage as the current dispersion value.

6. The NOR Flash memory device of claim 1 wherein each measurement signal is an analog voltage obtained by charging a capacitor with a selected current during the read operation.

7. The NOR Flash memory device of claim 1 wherein the reference dispersion value is established by recording a current dispersion value determined by the dispersion analyzer at a selected prior time.

8. The NOR Flash memory device of claim 1 further comprising means for moving data recorded on the set of memory cells to a second set of memory cells in response to the dispersion analyzer's output signal.

9. The NOR Flash memory device of claim 1 wherein each measurement unit measures the memory cell's time to completion as a time from triggering the sense amplifiers used in the read operation to full output voltage.

10. The NOR Flash memory device of claim 1 further comprising means for determining a confidence level for each memory cell based upon divergence of the measurement signal from a predetermined mean value.

11. A method of operating a NOR Flash memory device comprising:
    generating a set of measurement values for a set of NOR Flash memory cells, each measurement value being indicative of a time to completion for one of the memory cells in a read operation;
    analyzing dispersion in the set of measurement values to determine a current dispersion value for the set of memory cells; and
    generating an output signal indicative of the current dispersion value differing from a reference dispersion value by more than a threshold amount.

12. The method of claim 11 wherein each measurement value is represented as an analog voltage.

13. The method of claim 12 wherein each memory cell includes a plurality of sense amplifiers that operate in parallel during a read operation and each measurement value is the time to completion for a read operation for a first sense amplifier in the memory cell to develop a full output voltage.

14. The method of claim 13 wherein a time to completion is determined for each sense amplifier and the first sense amplifier in the memory cell to develop a full output voltage is determined by a thermometer decoder which receives output from each sense amplifier.

15. The method of claim 13 wherein a time to completion is determined for each sense amplifier and each time to completion is passed to a multiplexor as an input and the first sense amplifier in the memory cell to develop a full output voltage is determined by a thermometer decoder which receives output from each sense amplifier and signals the multiplexor which input to pass through to the dispersion analyzer.

16. The method of claim 12 wherein analyzing dispersion further comprises:
    detecting a maximum value in the set of measurement values;
    detecting a minimum value in the set of measurement values; and
    determining a delta between the maximum time and the minimum time as the current dispersion value.

17. The method of claim 11 wherein the reference dispersion value is determined by recording a current dispersion value at a selected prior time.

18. The method of claim 11 further comprising moving data recorded on the set of memory cells to a second set of memory cells in response to the output signal indicative of the current dispersion value differing from a reference dispersion value by more than a threshold amount.

19. The method of claim 11 further comprising determining a confidence level for each memory cell based upon divergence of the measurement value from a predetermined mean value.

20. The method of claim 11 further comprising correcting errors using divergence of the measurement value for one or more memory cells from a predetermined mean value.

* * * * *